(12) United States Patent
Zhang et al.

(10) Patent No.: US 12,204,217 B2
(45) Date of Patent: Jan. 21, 2025

(54) DISPLAY PANEL INCLUDING GRAYSCALE COMBINED PIXEL

(71) Applicant: TCL China Star Optoelectronics Technology Co., Ltd., Guangdong (CN)

(72) Inventors: Yonglei Zhang, Guangdong (CN); Jhenwei He, Guangdong (CN); Tao He, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 601 days.

(21) Appl. No.: 17/435,117

(22) PCT Filed: Dec. 22, 2020

(86) PCT No.: PCT/CN2020/138178
§ 371 (c)(1),
(2) Date: Aug. 31, 2021

(87) PCT Pub. No.: WO2022/077760
PCT Pub. Date: Apr. 21, 2022

(65) Prior Publication Data
US 2022/0121073 A1    Apr. 21, 2022

(30) Foreign Application Priority Data
Oct. 16, 2020  (CN) .......................... 202011112006.X (51) Int. Cl.
*G02F 1/13*      (2006.01)
*G02F 1/1362*    (2006.01)
*H01L 27/12*     (2006.01)
*H10K 59/18*     (2023.01)
*H10K 59/35*     (2023.01)

(52) U.S. Cl.
CPC ...... *G02F 1/136286* (2013.01); *H01L 27/124* (2013.01); *G02F 2203/30* (2013.01); *H10K 59/18* (2023.02); *H10K 59/352* (2023.02)

(58) Field of Classification Search
CPC ......... G02F 1/136286; G02F 1/134345; G02F 2203/30; G02F 2201/52; H01L 27/124; H10K 59/352; H10K 59/18
See application file for complete search history.

(56) References Cited

U.S. PATENT DOCUMENTS

| | | | |
|---|---|---|---|
| 11,250,799 B2* | 2/2022 | Shan | G02F 1/136286 |
| 2016/0035292 A1* | 2/2016 | Lee | G09G 3/3648 345/694 |
| 2016/0104448 A1* | 4/2016 | Lee | G09G 3/3607 345/205 |

(Continued)

FOREIGN PATENT DOCUMENTS

| CN | 104166258 | 11/2014 |
|---|---|---|
| CN | 104167194 | 11/2014 |

(Continued)

*Primary Examiner* — Ida M Soward (57) ABSTRACT

A display panel includes a plurality of pixel units arranged in an array and a plurality of data lines. The pixel units in two adjacent rows in two adjacent columns form a grayscale combined pixel. The grayscale combined pixel comprises three sub-pixels corresponding to the high grayscale and nine sub-pixels corresponding to the low grayscale.

20 Claims, 6 Drawing Sheets

(56) References Cited

U.S. PATENT DOCUMENTS

| | | | |
|---|---|---|---|
| 2016/0116807 A1* | 4/2016 | Lim | G02F 1/134309 |
| | | | 349/37 |
| 2016/0155400 A1* | 6/2016 | Namkung | G09G 3/3607 |
| | | | 345/205 |
| 2016/0275843 A1* | 9/2016 | Shin | G09G 3/3614 |
| 2017/0116934 A1* | 4/2017 | Tien | G09G 3/364 |
| 2019/0206341 A1* | 7/2019 | Liao | G02F 1/1343 |
| 2020/0090617 A1* | 3/2020 | Liao | G09G 3/3614 |
| 2020/0184913 A1* | 6/2020 | Huang | G09G 3/3685 |

FOREIGN PATENT DOCUMENTS

| | | | | |
|---|---|---|---|---|
| CN | 104517576 | | 4/2015 | |
| CN | 111025791 | | 4/2020 | |
| EP | 2669882 A2 | * | 12/2013 | G02F 1/134336 |
| KR | 20120090888 A | * | 8/2012 | G02F 1/133 |
| KR | 20160111598 A | * | 9/2016 | G09G 3/3648 |
| WO | WO 2013/022007 | | 2/2013 | |
| WO | WO-2013022007 A1 | * | 2/2013 | G09G 3/3406 |

\* cited by examiner

DISPLAY PANEL INCLUDING GRAYSCALE COMBINED PIXEL

RELATED APPLICATIONS

This application is a National Phase of PCT Patent Application No. PCT/CN2020/138178 having International filing date of Dec. 22, 2020, which claims the benefit of priority of Chinese Patent Application No. 202011112006.X filed on Oct. 16, 2020. The contents of the above applications are all incorporated by reference as if fully set forth herein in their entirety.

FIELD AND BACKGROUND OF THE INVENTION

The present disclosure relates to the technical field of display, and particularly to a display panel.

As people continue to demand display quality of liquid crystal televisions, ultra-wide viewing angles and image fineness have become a new development trend. With regard to improving display quality of high resolution liquid crystal televisions, current display panel arrangements still have room for improvement in terms of improving viewing angles.

Therefore, providing a display panel that can improve viewing angles of the display panel has become an urgent technical problem to be solved by those skilled in the art.

SUMMARY OF THE INVENTION

The present disclosure provides a display panel that can improve viewing angles of the display panel.

The present disclosure provides a display panel comprising a plurality of pixel units arranged in an array and a plurality of data lines. Each of the pixel units comprises three sub-pixels with different colors. The sub-pixels are arranged between adjacent data lines. Each of the sub-pixels corresponds to a high grayscale or a low grayscale. The sub-pixels in a same column have a same color. The pixel units in two adjacent rows in two adjacent columns form a grayscale combined pixel. The grayscale combined pixel comprises three sub-pixels of different colors corresponding to the high grayscale and nine sub-pixels corresponding to the low grayscale.

In some embodiments, the grayscale combined pixel comprises three sub-grayscale combined pixels arranged in sequence. Each of the sub-grayscale combined pixels comprises one sub-pixel corresponding to the high grayscale and three sub-pixels corresponding to the low grayscale.

In some embodiments, four adjacent sub-pixels in the same column comprise one sub-pixel corresponding to the high grayscale and three sub-pixels corresponding to the low grayscale.

In some embodiments, when the sub-pixel in a first row in a first column in the display panel corresponds to the high grayscale, the sub-pixel in the first row in the first column has a negative polarity.

In some embodiments, the sub-pixels corresponding to the high grayscale in the grayscale combined pixels in adjacent columns are located in different rows.

In some embodiments, the grayscale combined pixel comprises a first pixel unit, a second pixel unit, a third pixel unit, and a fourth pixel unit. The first pixel unit and the second pixel unit are located in a row in the grayscale combined pixel. The third pixel unit and the fourth pixel unit are located in the other row of the grayscale combined pixel. The first pixel unit comprises three sub-pixels corresponding to the high grayscale. Each of the second pixel unit, the third pixel unit, and the fourth pixel unit comprises three sub-pixels corresponding to the low grayscale.

In some embodiments, the second pixel unit comprises three sub-pixels corresponding to a first low grayscale. The third pixel unit comprises three sub-pixels corresponding to a second low grayscale. The fourth pixel unit comprises three sub-pixels corresponding to a third low grayscale.

In some embodiments, a grayscale value of the high grayscale is greater than a grayscale value of the low grayscale. The first low grayscale, the second low grayscale, and the third low grayscale have different grayscale values.

In some embodiments, each of the pixel units comprises a red sub-pixel, a green sub-pixel, and a blue sub-pixel that are sequentially arranged along a horizontal direction.

In some embodiments, the sub-pixels in adjacent rows have opposite polarities, and the sub-pixels in adjacent columns have opposite polarities.

The present disclosure further provides a display panel comprising a plurality of pixel units arranged in a matrix array and a plurality of data lines. Each of the pixel units comprises three sub-pixels with different colors. The sub-pixels are arranged between adjacent data lines. Each of the sub-pixels corresponds to a high grayscale or a low grayscale. The pixel units in two adjacent rows in two adjacent columns form a grayscale combined pixel. The grayscale combined pixel comprises three sub-pixels of different colors corresponding to the high grayscale and nine sub-pixels corresponding to the low grayscale. Each column of the sub-pixels is arranged between two adjacent data lines in a horizontal direction. The sub-pixels in a same column have a same color.

In some embodiments, the grayscale combined pixel comprises three sub-grayscale combined pixels arranged in sequence. Each of the sub-grayscale combined pixels comprises one sub-pixel corresponding to the high grayscale and three sub-pixels corresponding to the low grayscale.

In some embodiments, four adjacent sub-pixels in the same column comprise one sub-pixel corresponding to the high grayscale and three sub-pixels corresponding to the low grayscale.

In some embodiments, when the sub-pixel in a first row in a first column in the display panel corresponds to the high grayscale, the sub-pixel in the first row in the first column has a negative polarity.

In some embodiments, the sub-pixels corresponding to the high grayscale in the grayscale combined pixels in adjacent columns are located in different rows.

In some embodiments, the grayscale combined pixel comprises a first pixel unit, a second pixel unit, a third pixel unit, and a fourth pixel unit. The first pixel unit and the second pixel unit are located in a row in the grayscale combined pixel. The third pixel unit and the fourth pixel unit are located in the other row of the grayscale combined pixel. The first pixel unit comprises three sub-pixels corresponding to the high grayscale. Each of the second pixel unit, the third pixel unit, and the fourth pixel unit comprises three sub-pixels corresponding to the low grayscale.

In some embodiments, the second pixel unit comprises three sub-pixels corresponding to a first low grayscale. The third pixel unit comprises three sub-pixels corresponding to a second low grayscale. The fourth pixel unit comprises three sub-pixels corresponding to a third low grayscale.

In some embodiments, a grayscale value of the high grayscale is greater than a grayscale value of the low grayscale. The first low grayscale, the second low grayscale, and the third low grayscale have different grayscale values.

In some embodiments, each of the pixel units comprises a red sub-pixel, a green sub-pixel, and a blue sub-pixel that are sequentially arranged along a horizontal direction.

In some embodiments, the sub-pixels in adjacent rows have opposite polarities, and the sub-pixels in adjacent columns have opposite polarities.

The present disclosure provides a display panel comprising a plurality of pixel units arranged in an array and a plurality of data lines. Each of the pixel units comprises three sub-pixels with different colors. The sub-pixels are arranged between adjacent data lines. Each of the sub-pixels corresponds to a high grayscale or a low grayscale. The sub-pixels in a same column have a same color. The pixel units in two adjacent rows in two adjacent columns form a grayscale combined pixel. The grayscale combined pixel comprises three sub-pixels of different colors corresponding to the high grayscale and nine sub-pixels corresponding to the low grayscale. In the present disclosure, one high grayscale and three low grayscales replace a grayscale of one sub-pixel to further increase a difference between the high grayscale and the low grayscales, thereby further improving viewing angles of the display panel.

BRIEF DESCRIPTION OF THE SEVERAL VIEWS OF THE DRAWINGS

In order to more clearly illustrate technical solutions in embodiments of the present disclosure, a brief description of accompanying drawings used in a description of the embodiments will be given below. Obviously, the accompanying drawings in the following description are merely some embodiments of the present disclosure. For those skilled in the art, other drawings may be obtained from these accompanying drawings without creative labor.

DESCRIPTION OF THE SEVERAL VIEWS OF THE DRAWINGS

Technical solutions in embodiments of the present disclosure will be clearly and completely described below in conjunction with accompanying drawings in the embodiments of the present disclosure. Apparently, the described embodiments are merely some of the embodiments of the present disclosure and not all embodiments. All other embodiments obtained by those skilled in the art based on the embodiments of the present disclosure without creative labor are within the claimed scope of the present disclosure.

It should be noted that in a description of the present disclosure, it should be understood that location or position relationships indicated by terms, such as "up", "down", "front", "rear", "left", "right", "inside", and "outside", are location or position relationships based on illustration of the accompanying drawings, are merely used for describing the present disclosure and simplifying the description instead of indicating or implying the indicated apparatuses or elements should have specified locations or be constructed and operated according to specified locations, and therefore, should not be intercepted as limitations to the present disclosure.

Figure 1:
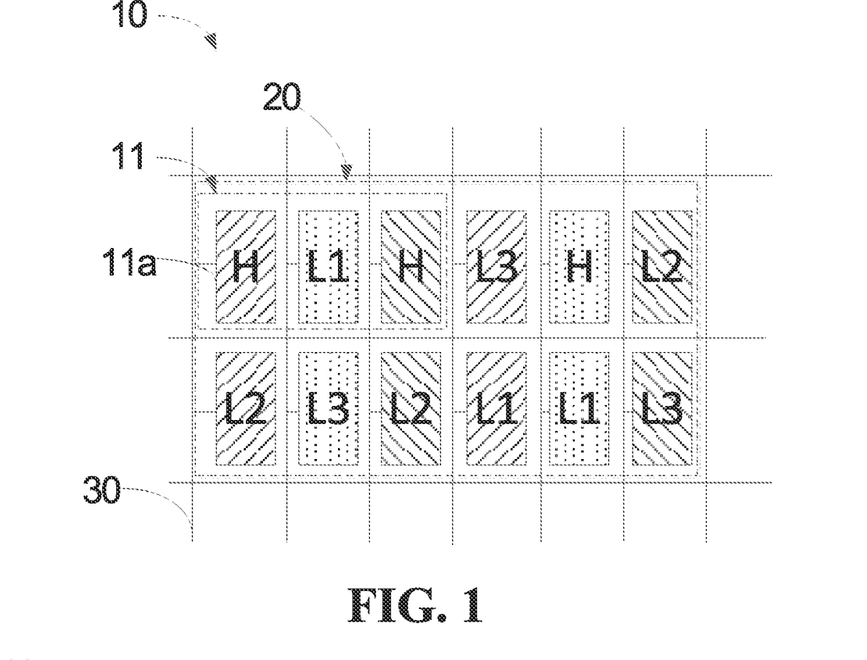
FIG. 1 is a schematic diagram of a first structure of a display panel according to an embodiment of the present disclosure.

Please refer to FIG. 1, which is a schematic diagram of a first structure of a display panel 10 according to an embodiment of the present disclosure. The present disclosure provides a display panel 10. The display panel 10 comprises a plurality of pixel units 11 arranged in an array and a plurality of data lines 30. Each of the pixel units 11 comprises three sub-pixels 11a with different colors. The sub-pixels 11a are arranged between adjacent data lines 30. Each of the sub-pixels 11a corresponds to a high grayscale H or a low grayscale (L1, L2, or L3). The sub-pixels 11a in a same column have a same color. The pixel units 11 in two adjacent rows in two adjacent columns form a grayscale combined pixel 20. The grayscale combined pixel 20 comprises three sub-pixels 11a of different colors corresponding to the high grayscale H and nine sub-pixels 11a corresponding to the low grayscale (L1, L2, and L3).

It should be noted that the display panel 10 of the present disclosure can be used in a display panel. Based on the display panel 10 of the present disclosure, viewing angles of the display panel during display are increased. Specifically, the pixel units 11 are arranged in a matrix array. Each column of the sub-pixels 11a is arranged between two adjacent data lines 30 in a horizontal direction. The sub-pixels 11a in a same column have a same color. Specifically, one sub-pixel 11a corresponding to the high grayscale H and three sub-pixels 11a corresponding to the low grayscales (L1, L2, and L3) in the grayscale combined pixel 20 replace one sub-pixel 11a of an original grayscale. The grayscale combined pixel 20 comprises three sub-pixels 11a of different colors corresponding to the high grayscale H and nine sub-pixels 11a corresponding to the low grayscale (L1, L2, and L3), so one grayscale combined pixel 20 can replace three sub-pixels 11a of the original grayscales. One sub-pixel 11a of the original grayscale is replaced with one sub-pixel 11a corresponding to the high grayscale H and three sub-pixels 11a corresponding to the low grayscales (L1, L2, and L3), which further increases a difference between the high grayscale H and the low grayscales (L1, L2, and L3). Therefore, viewing angles of the display panel 10 are further improved.

Figure 2:
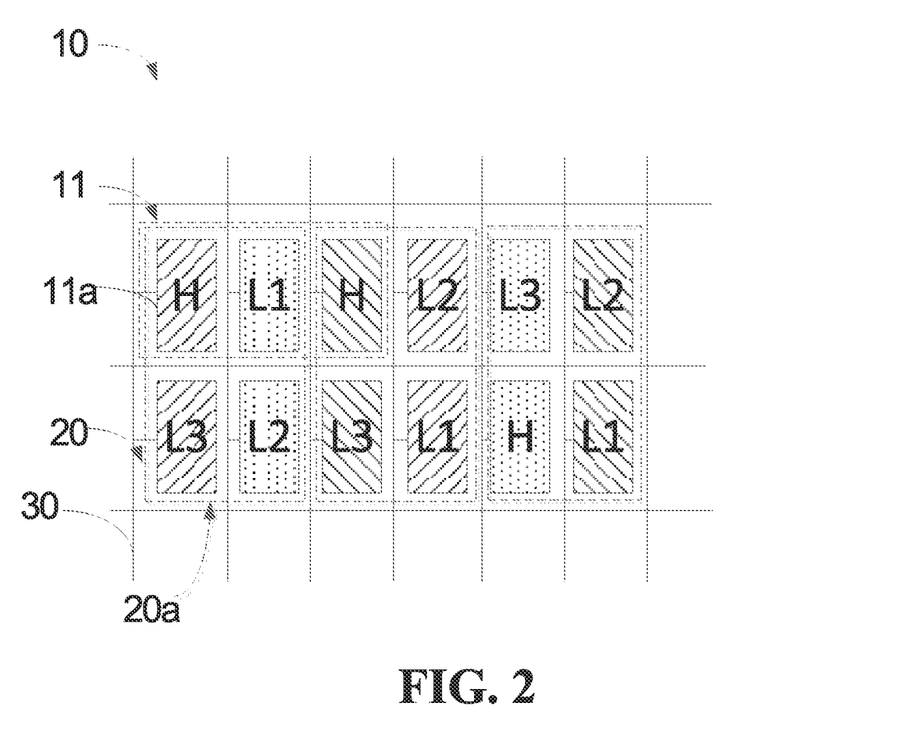
FIG. 2 is a schematic diagram of a second structure of a display panel according to an embodiment of the present disclosure.

Please refer to FIG. 2, which is a schematic diagram of a second structure of a display panel 10 according to an embodiment of the present disclosure. The grayscale combined pixel 20 comprises three sub-grayscale combined pixels 20a arranged in sequence. Each of the sub-grayscale combined pixels 20a comprises one sub-pixel 11a corresponding to the high grayscale H and three sub-pixels 11a corresponding to the low grayscales (L1, L2, and L3).

Figure 3:
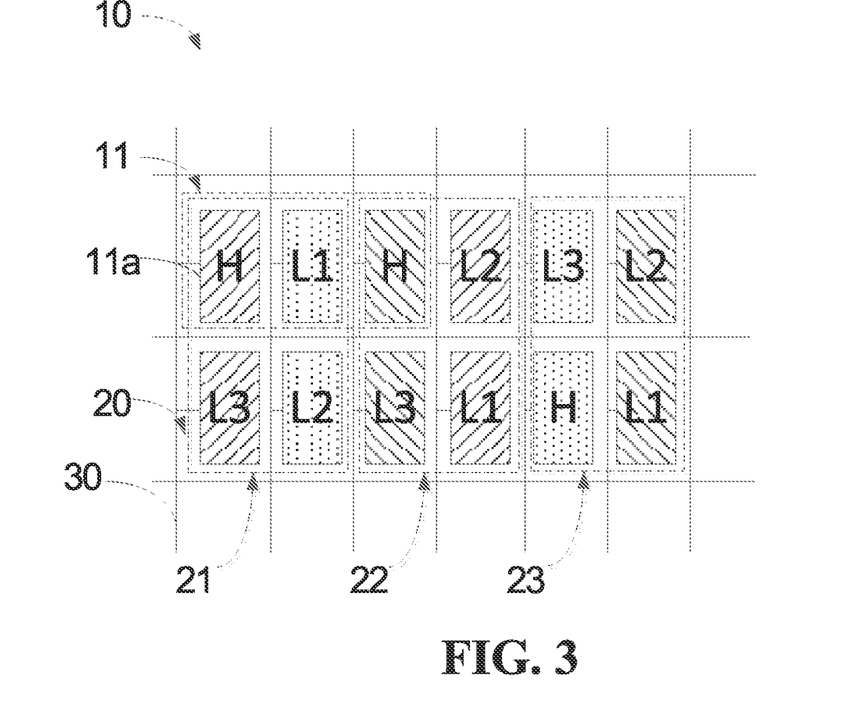
FIG. 3 is a schematic diagram of a third structure of a display panel according to an embodiment of the present disclosure.

It should be noted that one sub-grayscale combined pixel 20a replaces one sub-pixel 11a of the original grayscale. In some embodiments, as shown in FIG. 3, the grayscale combined pixel 20 comprises a first sub-grayscale combined pixel 21, a second sub-grayscale combined pixel 22, and a third sub-grayscale combined pixel 23. The first sub-grayscale combined pixel 21, the second sub-grayscale combined pixel 22, and the third sub-grayscale combined pixel 23 are arranged in order from left to right. Each of the first sub-grayscale combined pixel 21, the second sub-grayscale combined pixel 22, and the third sub-grayscale combined pixel 23 comprises one sub-pixel 11a corresponding to the high grayscale H and three sub-pixels 11a corresponding to the low grayscales (L1, L2, and L3). One sub-grayscale combined pixel 20a replaces one sub-pixel 11a of the original grayscale, which further increases the difference between the high grayscale H and the low grayscales (L1, L2, and L3). Therefore, the viewing angles of the display panel 10 are further improved.

In addition, an arrangement order of the one sub-pixel 11a corresponding to the high grayscale H and the three sub-pixels 11a corresponding to the low grayscales (L1, L2, and L3) in the sub-grayscale combined pixel 20a may be adjusted freely, which will not be described in details in the embodiments of the present disclosure.

Figure 4:
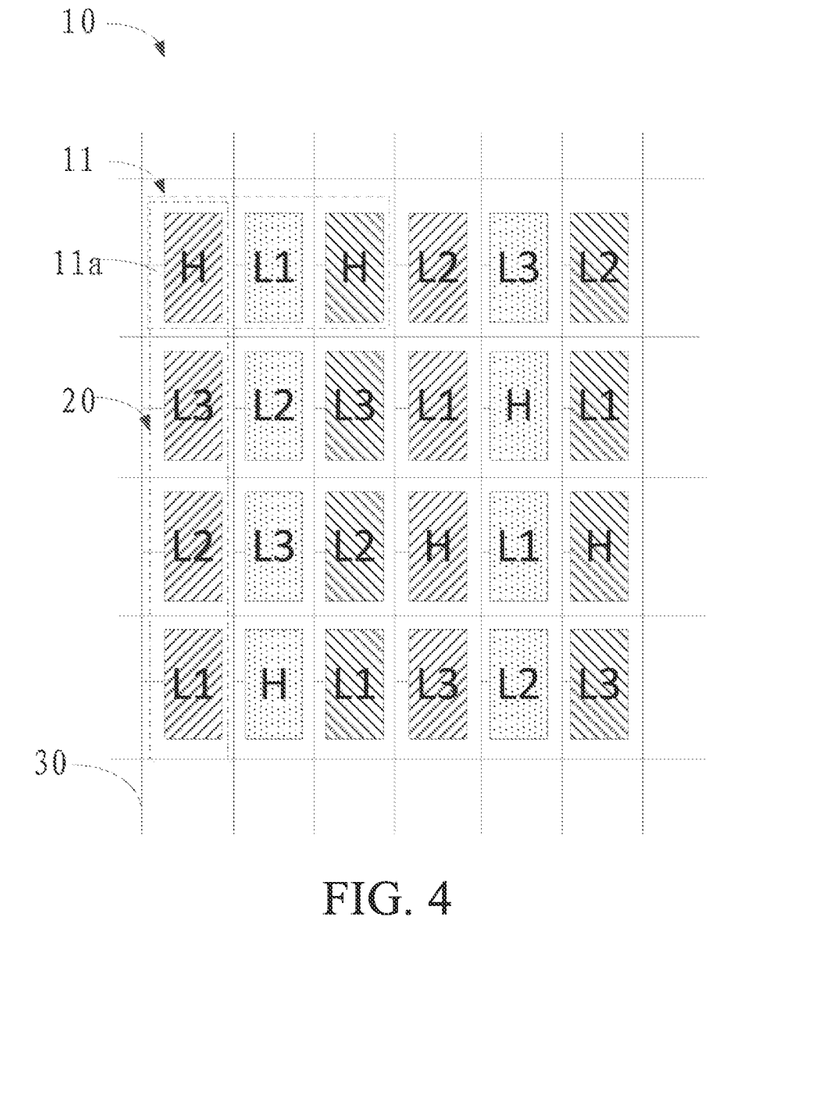
FIG. 4 is a schematic diagram of a fourth structure of a display panel according to an embodiment of the present disclosure.

Please refer to FIG. 4, which is a schematic diagram of a fourth structure of a display panel 10 according to an embodiment of the present disclosure. The display panel 10 of this embodiment differs from that of the foregoing embodiments in that in the foregoing embodiments, the pixel units 11 in two adjacent rows in two adjacent columns are cyclically arranged, while in this embodiment, the pixel units 11 in four adjacent rows in two adjacent columns are cyclically arranged. Furthermore, in this embodiment, four adjacent sub-pixels in the same column from one grayscale combined pixel 20 and comprise one sub-pixel 11a corresponding to the high grayscale H and three sub-pixels 11a corresponding to the low grayscales (L1, L2, and L3).

It should be noted that this embodiment not only needs to ensure that the sub-pixels 11a in two adjacent rows in two adjacent columns comprise one sub-pixel 11a corresponding to the high grayscale H and three sub-pixels 11a corresponding to the low grayscales (L1, L2, and L3), but also needs to ensure that four adjacent sub-pixels in the same column comprise one sub-pixel 11a corresponding to the high grayscale H and the three sub-pixels 11a corresponding to the low grayscales (L1, L2, and L3). This embodiment uses such a pixel arrangement structure to make an arrangement of the sub-pixels 11a more balanced, which is beneficial to improve quality of the display panel 10.

Specifically, the grayscale combined pixel 20 comprises one sub-pixel 11a corresponding to the high grayscale H and three sub-pixels 11a corresponding to the low grayscales (L1, L2, and L3).

Figure 5:
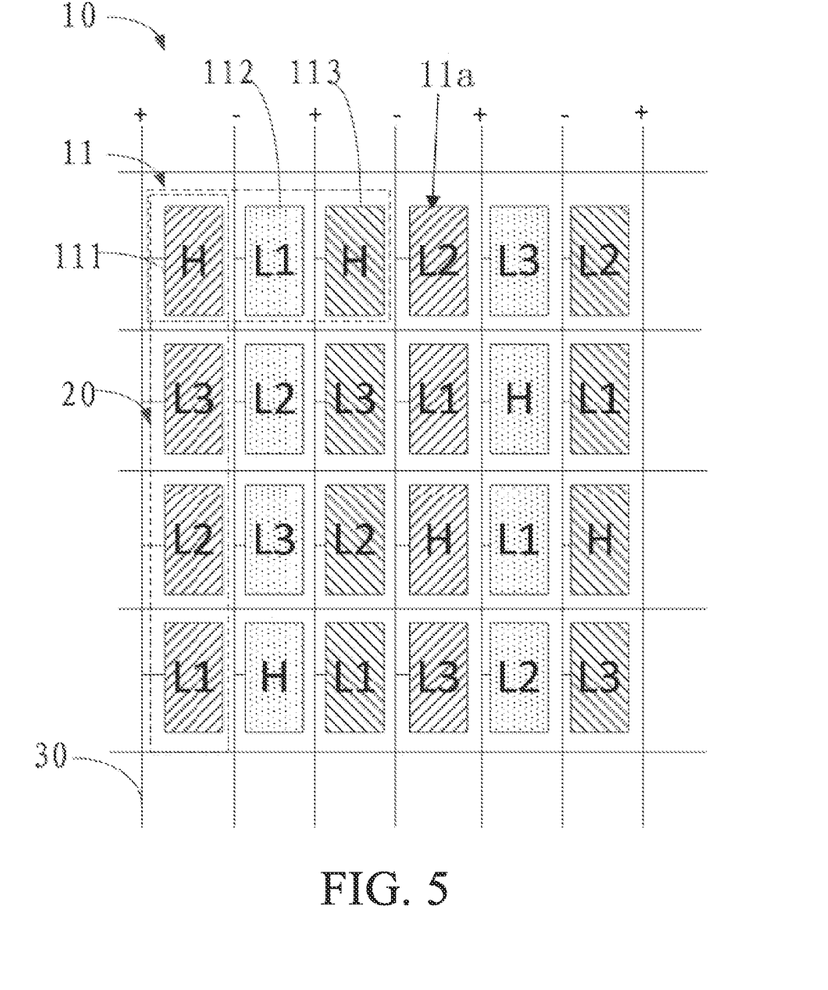
FIG. 5 is a schematic diagram of a fifth structure of a display panel according to an embodiment of the present disclosure.

Please refer to FIG. 5, which is a schematic diagram of a fifth structure of a display panel 10 according to an embodiment of the present disclosure. When the sub-pixel 11a in a first row in a first column in the display panel 10 corresponds to the high grayscale H, the sub-pixel 11a in the first row in the first column has a negative polarity. When the sub-pixel 11a in the first row in the first column corresponds to the high grayscale H, avoid the sub-pixel 11a in the first row in the first column from having a positive polarity, which improves a display effect of the display panel 10.

In another embodiment, if the sub-pixel 11a in the first row in the first column in the display panel 10 corresponds to the high grayscale H, and the sub-pixel 11a in the first row in the first column has the positive polarity, grayscale values of the three low grayscales (L1, L2, and L3) are increased. By increasing the grayscale values of the three low grayscales (L1, L2, and L3), influence of "the sub-pixel 11a in the first row in the first column in the display panel 10 corresponds to the high grayscale H" and "the sub-pixel 11a in the first row in the first column has the positive polarity" on the display effect of the display panel 10 is eliminated.

The sub-pixels 11a corresponding to the high grayscale H in the grayscale combined pixels 20 in adjacent columns are located in different rows. Staggering the sub-pixels 11a corresponding to the high grayscale H in the grayscale combined pixels 20 in adjacent columns prevents uneven display of the display panel 10. This structure improves display quality of the display panel 10.

Figure 6:
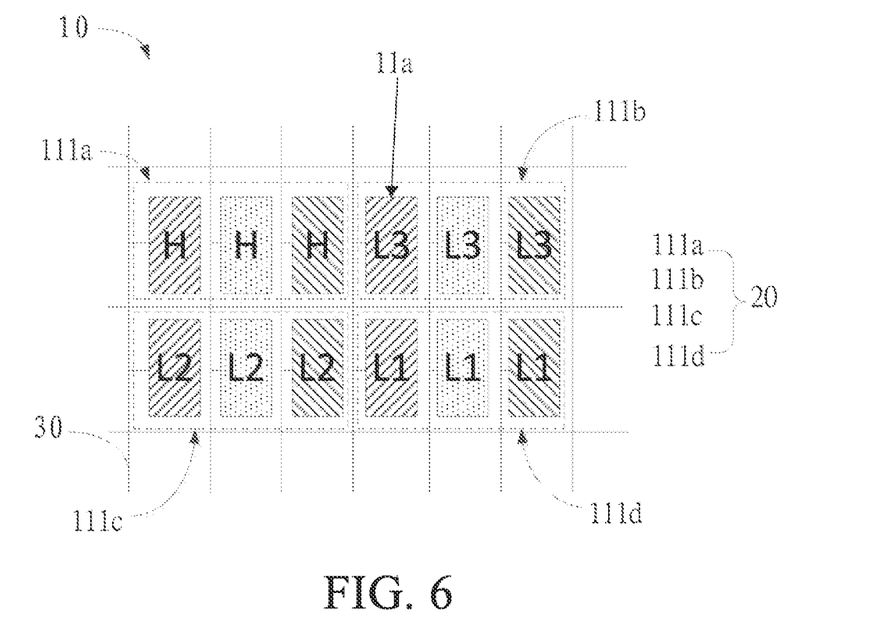
FIG. 6 is a schematic diagram of a sixth structure of a display panel according to an embodiment of the present disclosure.

Please refer to FIG. 6, which is a schematic diagram of a sixth structure of a display panel 10 according to an embodiment of the present disclosure. The grayscale combined pixel 20 comprises a first pixel unit 111a, a second pixel unit 111b, a third pixel unit 111c, and a fourth pixel unit 111d. The first pixel unit 111a and the second pixel unit 111b are located in a row in the grayscale combined pixel 20. The third pixel unit 111c and the fourth pixel unit 111d are located in the other row of the grayscale combined pixel 20. The first pixel unit 111a comprises three sub-pixels 11a corresponding to the high grayscale H. Each of the second pixel unit 111b, the third pixel unit 111c, and the fourth pixel 111d comprises three sub-pixels 11a corresponding to the low grayscales (L1, L2, and L3). The second pixel unit 111b comprises three sub-pixels 11a corresponding to a first low grayscale L1. The third pixel unit 111c comprises three sub-pixels 11a corresponding to a second low grayscale L2. The fourth pixel unit 111d comprises three sub-pixels 11a corresponding to a third low grayscale L3.

It should be noted that grayscale values of the three sub-pixels 11a in the first pixel unit 111a are same, grayscale values of the three sub-pixels 11a in the second pixel unit 111b are same, grayscale values of the three sub-pixels 11a in the third pixel unit 111c are same, and grayscale values of the three sub-pixels 11a in the fourth pixel unit 111d are same. The grayscales corresponding to the sub-pixels 11a in the first pixel unit 111a, the second pixel unit 111b, the third pixel unit 111c, and the fourth pixel unit 111d may be exchanged. For example, the first pixel unit 111a comprises three sub-pixels 11a corresponding to the first low grayscale L1, the second pixel unit 111b comprises three sub-pixels 11a corresponding to the second low grayscale L2, the third pixel unit 111c comprises three sub-pixels 11a corresponding to the third low grayscale L3, and the fourth pixel unit 111d comprises three sub-pixels 11a corresponding to the high grayscale H. In the display panel 10 of this embodiment, the original grayscales of all the sub-pixels 11a in one pixel unit 11 may be replaced to further increase the difference between the high grayscale H and the low grayscales (L1, L2, and L3), thereby further improving the viewing angles of the display panel 10.

A grayscale value of the high grayscale H is greater than grayscale values of the low grayscales (L1, L2, and L3). The first low grayscale L1, the second low grayscale L2, and the third low grayscale L3 have different grayscale values.

It should be noted that the grayscale value of the first low grayscale L1 may be greater than the grayscale value of the second low grayscale L2, and the grayscale value of the second low grayscale L2 may be greater than the grayscale value of the third low grayscale L3. In some embodiments, a relationship between the grayscale values of the first low grayscale L1, the second low grayscale L2, and the third low grayscale L3 may be adjusted. In other embodiments, the first low grayscale L1, the second low grayscale L2, and the third low grayscale L3 may have a same grayscale value.

Figure 7:
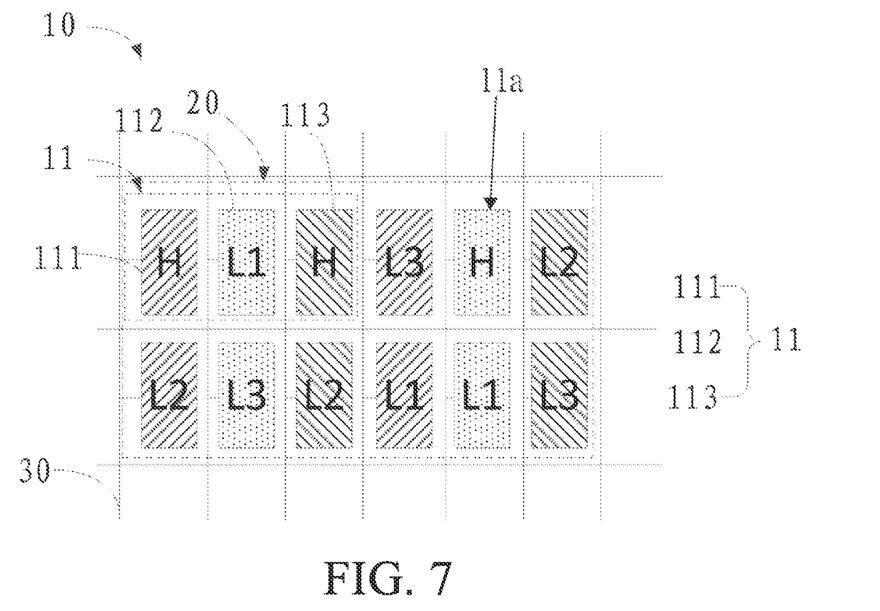
FIG. 7 is a schematic diagram of a seventh structure of a display panel according to an embodiment of the present disclosure.

Please refer to FIG. 7, which is a schematic diagram of a seventh structure of a display panel 10 according to an embodiment of the present disclosure. Each of the pixel units 11 comprises a red sub-pixel 111, a green sub-pixel 112, and a blue sub-pixel 113 that are sequentially arranged along a horizontal direction.

It should be noted that arrangement positions of the red sub-pixel 111, the green sub-pixel 112, and the blue sub-pixel 113 may also be changed. For example, the blue sub-pixel 113, the green sub-pixel 112, and the red sub-pixel 111 are arranged in order from left to right in the horizontal direction.

The high grayscale H and the low grayscales (L1, L2, and L3) corresponding to the sub-pixels 11a are obtained by looking up values corresponding to the original grayscales of the sub-pixels 11a through a wide viewing angle algorithm.

It should be noted that the wide viewing angle algorithm preprocesses the data lines 30 without changing original display brightness. For example, taking 128 grayscale display of the red sub-pixel 111 as an example, find one high grayscale H and three low grayscales (L1, L2, and L3) of the red sub-pixel 111 on a front-view gamma curve, and an average brightness of the one high grayscale H and the three low grayscales (L1, L2, and L3) of the red sub-pixel 111 is equal to a brightness of four original red sub-pixels 111 with 128 grayscale. In this way, the one high grayscale H and the three low grayscales (L1, L2, and L3) of the red sub-pixel 111 are obtained. Of course, one high grayscale H and three low grayscales (L1, L2, and L3) of each of the green sub-pixel 112 and the blue sub-pixel 113 can be found by a same method.

Figure 8:
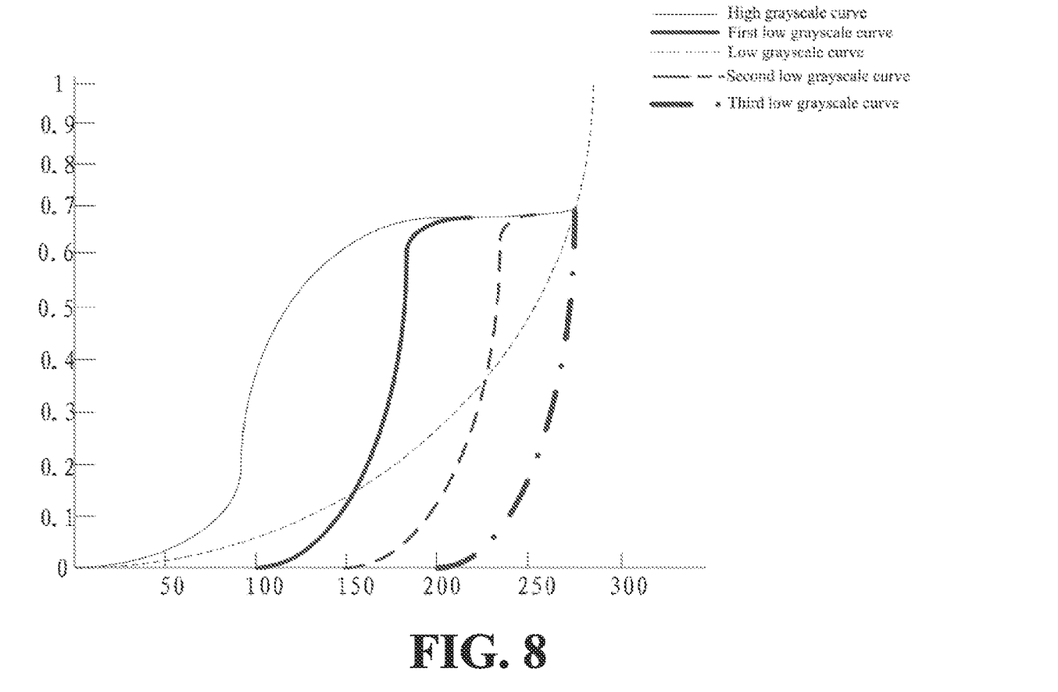
FIG. 8 is an effect diagram of gamma curves of a display panel according to an embodiment of the present disclosure.
Figure 9:
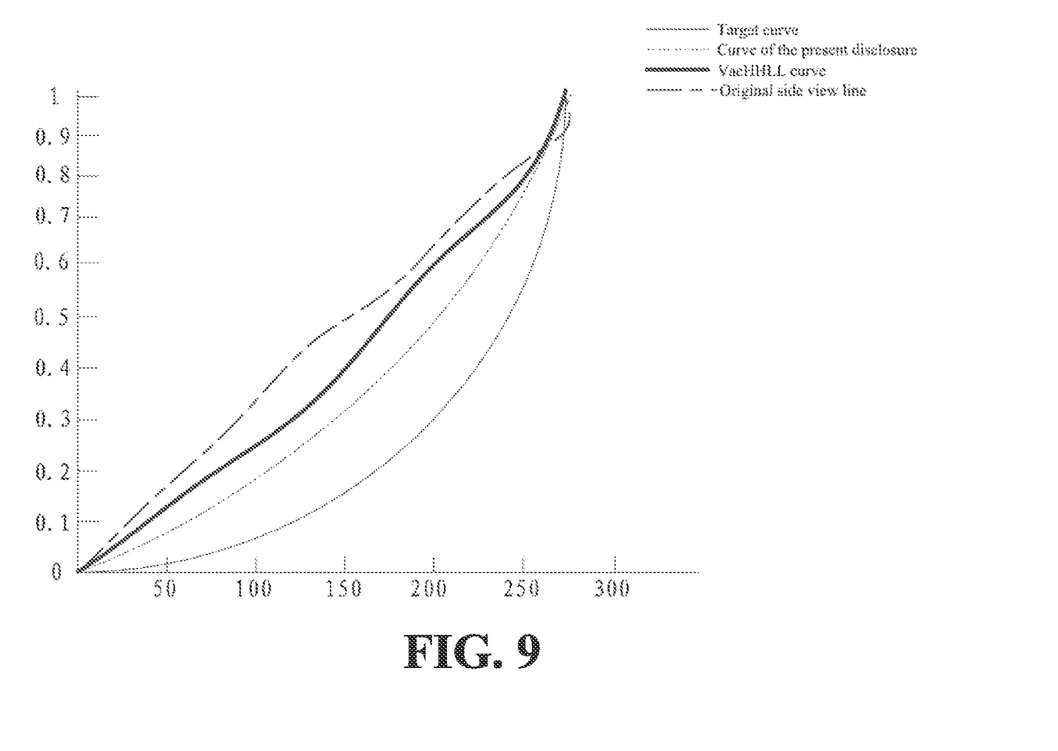
FIG. 9 is a comparison diagram of a gamma curve of a display panel according to an embodiment of the present disclosure and gamma curves of other display panels.

Please refer to FIG. 8, which is an effect diagram of gamma curves of a display panel according to an embodiment of the present disclosure. In the prior art, sub-pixels are processed by the wide viewing angle algorithm to obtain a gamma curve of high grayscale 1H and low grayscale L. In this disclosure, one original low grayscale L is replaced with three low grayscales (L1, L2, and L3), which further increases the difference between the high grayscale H and the low grayscales (L1, L2, and L3). Therefore, the viewing angles of the display panel 10 are further improved. Please refer to FIG. 9, which is a comparison diagram of a gamma curve of a display panel according to an embodiment of the present disclosure and gamma curves of other display panels. A target curve is an effect curve of a target side view. The closer to the target curve, the better the display effect. A VacHHLL curve is a curve obtained by looking up VAC values of the display panel 10. An original side view line is a curve obtained without looking up VAC values.

The sub-pixels 11a in adjacent rows have opposite polarities, and the sub-pixels 11a in adjacent columns have opposite polarities.

The present disclosure provides a display panel 10 comprising a plurality of pixel units 11 arranged in an array and a plurality of data lines 30. Each of the pixel units 11 comprises three sub-pixels 11a with different colors. The sub-pixels 11a are arranged between adjacent data lines 30. Each of the sub-pixels 11a corresponds to a high grayscale H or a low grayscale (L1, L2, or L3). The sub-pixels 11a in a same column have a same color. The pixel units 11 in two adjacent rows in two adjacent columns form a grayscale combined pixel 20. The grayscale combined pixel 20 comprises three sub-pixels 11a of different colors corresponding to the high grayscale H and nine sub-pixels 11a corresponding to the low grayscales (L1, L2, or L3). In the present disclosure, one high grayscale H and three low grayscales (L1, L2, or L3) replace a grayscale of one sub-pixel 11a to further increase the difference between the high grayscale H and the low grayscales (L1, L2, or L3), thereby further improving the viewing angles of the display panel 10.

The display panel 10 of the present disclosure can be used in, for example, at least one of a smartphone, a tablet personal computer, a mobile phone, a video phone, an e-book reader, a desktop PC, a laptop PC, a netbook computer, a workstation, a server, a personal digital assistant, a portable multimedia player, an MP3 player, a mobile medical device, a camera, a game console, a digital camera, a car navigation system, an electronic billboard, an automated teller machine, and a wearable device.

The display panel provided by the embodiments of the present disclosure is described in detail above. The present disclosure uses specific examples to describe principles and embodiments of the present invention. The above description of the embodiments is only for helping to understand the present invention. Furthermore, those skilled in the art may make modifications to the specific embodiments and applications according to ideas of the present invention. In conclusion, the present specification should not be construed as a limitation to the present invention.

What is claimed is:

1. A display panel, comprising:
   a plurality of pixel units arranged in an array, wherein each of the pixel units comprises three sub-pixels with different colors; and
   a plurality of data lines, wherein the sub-pixels are arranged between adjacent data lines;
   wherein each of the sub-pixels corresponds to a high grayscale or a low grayscale, the sub-pixels in a same column have a same color, the pixel units in two adjacent rows and in six adjacent columns form a grayscale combined pixel, and the grayscale combined pixel comprises three sub-pixels of different colors corresponding to the high grayscale and nine sub-pixels corresponding to the low grayscale.

2. The display panel according to claim 1, wherein the grayscale combined pixel comprises three sub-grayscale combined pixels arranged in sequence, and each of the sub-grayscale combined pixels comprises one sub-pixel corresponding to the high grayscale and three sub-pixels corresponding to the low grayscale.

3. The display panel according to claim 2, wherein four adjacent sub-pixels in the same column comprise one sub-pixel corresponding to the high grayscale and three sub-pixels corresponding to the low grayscale.

4. The display panel according to claim 3, wherein when the sub-pixel in a first row in a first column in the display panel corresponds to the high grayscale, the sub-pixel in the first row in the first column has a negative polarity.

5. The display panel according to claim 3, wherein the sub-pixels corresponding to the high grayscale in the grayscale combined pixels in adjacent columns are located in different rows.

6. The display panel according to claim 1, wherein
   the grayscale combined pixel comprises a first pixel unit, a second pixel unit, a third pixel unit, and a fourth pixel unit;
   the first pixel unit and the second pixel unit are located in a row in the grayscale combined pixel;
   the third pixel unit and the fourth pixel unit are located in the other row of the grayscale combined pixel;

the first pixel unit comprises three sub-pixels corresponding to the high grayscale; and
each of the second pixel unit, the third pixel unit, and the fourth pixel unit comprises three sub-pixels corresponding to the low grayscale.

7. The display panel according to claim 6, wherein the second pixel unit comprises three sub-pixels corresponding to a first low grayscale, the third pixel unit comprises three sub-pixels corresponding to a second low grayscale, and the fourth pixel unit comprises three sub-pixels corresponding to a third low grayscale.

8. The display panel according to claim 7, wherein a grayscale value of the high grayscale is greater than a grayscale value of the low grayscale, and the first low grayscale, the second low grayscale, and the third low grayscale have different grayscale values.

9. The display panel according to claim 1, wherein each of the pixel units comprises a red sub-pixel, a green sub-pixel, and a blue sub-pixel that are sequentially arranged along a horizontal direction.

10. The display panel according to claim 1, wherein the sub-pixels in adjacent rows have opposite polarities, and the sub-pixels in adjacent columns have opposite polarities.

11. A display panel, comprising:
a plurality of pixel units arranged in a matrix array, wherein each of the pixel units comprises three sub-pixels with different colors; and
a plurality of data lines, wherein the sub-pixels are arranged between adjacent data lines;
wherein each of the sub-pixels corresponds to a high grayscale or a low grayscale, the pixel units in two adjacent rows and in six adjacent columns form a grayscale combined pixel, the grayscale combined pixel comprises three sub-pixels of different colors corresponding to the high grayscale and nine sub-pixels corresponding to the low grayscale, each column of the sub-pixels is arranged between two adjacent two of the data lines, and the sub-pixels in a same column have a same color.

12. The display panel according to claim 11, wherein the grayscale combined pixel comprises three sub-grayscale combined pixels arranged in sequence, and each of the sub-grayscale combined pixels comprises one sub-pixel corresponding to the high grayscale and three sub-pixels corresponding to the low grayscale.

13. The display panel according to claim 12, wherein four adjacent sub-pixels in the same column comprise one sub-pixel corresponding to the high grayscale and three sub-pixels corresponding to the low grayscale.

14. The display panel according to claim 13, wherein when the sub-pixel in a first row in a first column in the display panel corresponds to the high grayscale, the sub-pixel in the first row in the first column has a negative polarity.

15. The display panel according to claim 13, wherein the sub-pixels corresponding to the high grayscale in the grayscale combined pixels in adjacent columns are located in different rows.

16. The display panel according to claim 11, wherein
the grayscale combined pixel comprises a first pixel unit, a second pixel unit, a third pixel unit, and a fourth pixel unit;
the first pixel unit and the second pixel unit are located in a row in the grayscale combined pixel;
the third pixel unit and the fourth pixel unit are located in the other row of the grayscale combined pixel;
the first pixel unit comprises three sub-pixels corresponding to the high grayscale; and
each of the second pixel unit, the third pixel unit, and the fourth pixel unit comprises three sub-pixels corresponding to the low grayscale.

17. The display panel according to claim 16, wherein the second pixel unit comprises three sub-pixels corresponding to a first low grayscale, the third pixel unit comprises three sub-pixels corresponding to a second low grayscale, and the fourth pixel unit comprises three sub-pixels corresponding to a third low grayscale.

18. The display panel according to claim 17, wherein a grayscale value of the high grayscale is greater than a grayscale value of the low grayscale, and the first low grayscale, the second low grayscale, and the third low grayscale have different grayscale values.

19. The display panel according to claim 11, wherein each of the pixel units comprises a red sub-pixel, a green sub-pixel, and a blue sub-pixel that are sequentially arranged along a horizontal direction.

20. The display panel according to claim 11, wherein the sub-pixels in adjacent rows have opposite polarities, and the sub-pixels in adjacent columns have opposite polarities.

* * * * *